United States Patent
Wang et al.

(10) Patent No.: US 8,859,358 B2
(45) Date of Patent: Oct. 14, 2014

(54) CMOS TRANSISTORS, FIN FIELD-EFFECT TRANSISTORS AND FABRICATION METHODS THEREOF

(71) Applicant: Semiconductor Manufacturing International Corp., Shanghai (CN)

(72) Inventors: Dongjiang Wang, Shanghai (CN); Steven Zhang, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 0 days.

(21) Appl. No.: 13/921,386

(22) Filed: Jun. 19, 2013

(65) Prior Publication Data

US 2014/0191304 A1 Jul. 10, 2014

(30) Foreign Application Priority Data

Jan. 8, 2013 (CN) .......................... 2013 1 0006452

(51) Int. Cl.
- *H01L 21/8238* (2006.01)
- *H01L 29/66* (2006.01)
- *H01L 29/78* (2006.01)

(52) U.S. Cl.
CPC .......... *H01L 29/6684* (2013.01); *H01L 29/784* (2013.01)
USPC ............... 438/199; 438/3; 438/142; 257/208; 257/241; 257/254; 257/295

(58) Field of Classification Search
None
See application file for complete search history.

(56) References Cited

U.S. PATENT DOCUMENTS 5,561,305 A * 10/1996 Smith ............................. 257/194
7,569,443 B2    8/2009 Kavalieros et al.

* cited by examiner

*Primary Examiner* — Kyoung Lee
(74) *Attorney, Agent, or Firm* — Anova Law Group, PLLC (57) ABSTRACT

A method is provided for fabricating a transistor. The method includes providing a semiconductor substrate; and configuring a channel region along a first direction. The method also includes forming trenches at both sides of the channel region along a second direction; and forming a magnetic material layer in each of the trenches. Further, the method includes magnetizing the magnetic material layers to form a magnetic field in the channel region between adjacent magnetic material layers; and forming source/drain regions at both ends of the channel region along the first direction.

20 Claims, 8 Drawing Sheets

CMOS TRANSISTORS, FIN FIELD-EFFECT TRANSISTORS AND FABRICATION METHODS THEREOF

CROSS-REFERENCES TO RELATED APPLICATIONS

This application claims the priority of Chinese patent application No. 201310006452.6, filed on Jan. 8, 2013, the entirety of which is incorporated herein by reference.

FIELD OF THE INVENTION

The present invention generally relates to the field of semiconductor manufacturing technology and, more particularly, relates to CMOS transistors, fin field-effect transistors and fabrication techniques thereof.

BACKGROUND

A stress may change the carrier mobility of a channel region in a transistor, thus controlling the stress has become a more and more common method to improve performance of transistors. The stress memorization technology (SMT) and the embedded silicon germanium (embedded SiGe) technology are two common methods to generate stress in a channel region of a transistor, and to increase the carrier mobility of the channel region. If the SMT and/or the embedded SiGe technology are used, when the channel region is on, a trajectory change of a portion of the carriers in the channel region may be prevented. The trajectory change may be caused by a reflection of crystal lattices during a motion of the carriers. Thus, the carrier mobility of the channel region may be improved, and the performance of the transistor may be enhanced.

Figure 1:
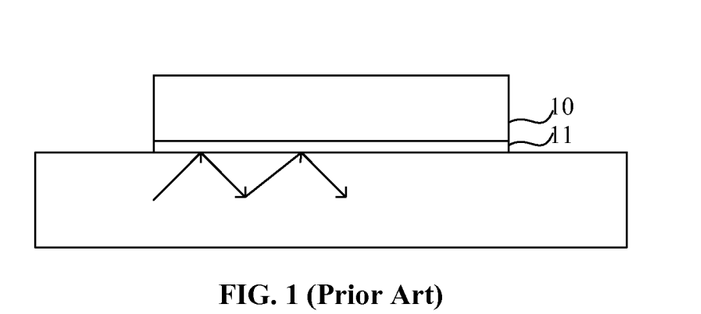
FIG. 1 illustrates a carrier reflection at the interface of a gate dielectric layer and a channel region of an existing transistor.

However, with the continuously shrinking of the critical dimension of semiconductor devices, the size of a channel correspondingly decreases, and a depth of the channel region also decreases. As shown in FIG. 1, when a channel region becomes shallower, a moving direction of a portion of moving carriers in the channel region under the gate 10 may be deflected. The portion of the moving carriers may reach an interface between a dielectric layer 11 and the channel region, and a reflection of the portion of the moving carriers may happen at the interface. Then, a direction and a velocity of the portion of the moving carriers may change. Thus, the mobility of the carriers in the channel region may be reduced, and the performance of the transistor may be reduced as well. The disclosed device structures, methods and systems are directed to solve one or more problems set forth above and other problems.

BRIEF SUMMARY OF THE DISCLOSURE

One aspect of the present disclosure includes a method for fabricating a transistor. The method includes providing a semiconductor substrate and configuring a channel region along a first direction. The method also includes forming isolation trenches at both sides of the channel region along a second direction; and forming a magnetic material layer in each of the isolation trenches. Further, the method includes magnetizing the magnetic material layers to form a magnetic field in the channel region between adjacent magnetic material layers; and forming source/drain regions at both ends of the channel region along the first direction.

Another aspect of the present disclosure includes a CMOS transistor. The CMOS transistor includes a semiconductor substrate having an active region, and a gate dielectric layer and a gate on the active region. The CMOS transistor also includes magnetic material layers at both sides of the active region along a second direction, and source/drain regions at both sides of the active region along a first direction perpendicular to the second direction. Further, the CMOS transistor includes a channel region between the source/drain regions; and a magnetic field in the channel region between two adjacent material layers along a second direction.

Another aspect of the present disclosure includes a fin field-effect transistor (FinFET). The fin field-effect transistor includes a semiconductor substrate, and a fin on the semiconductor substrate extending in a first direction. The fin field-effect transistor also includes a gate crossing over the fin on the semiconductor substrate extending in a second direction perpendicular to the first direction, and an interlayer dielectric layer on the semiconductor substrate. Further, the fin field-effect transistor includes magnetic material layers having a source pole and a north pole in the interlayer dielectric layer at both sides of the fin along a second direction, and source/drain regions at both ends of the fin along a first direction. Further, the fin field-effect transistor also includes a magnetic field in a channel region in the fin along the second direction.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 2:
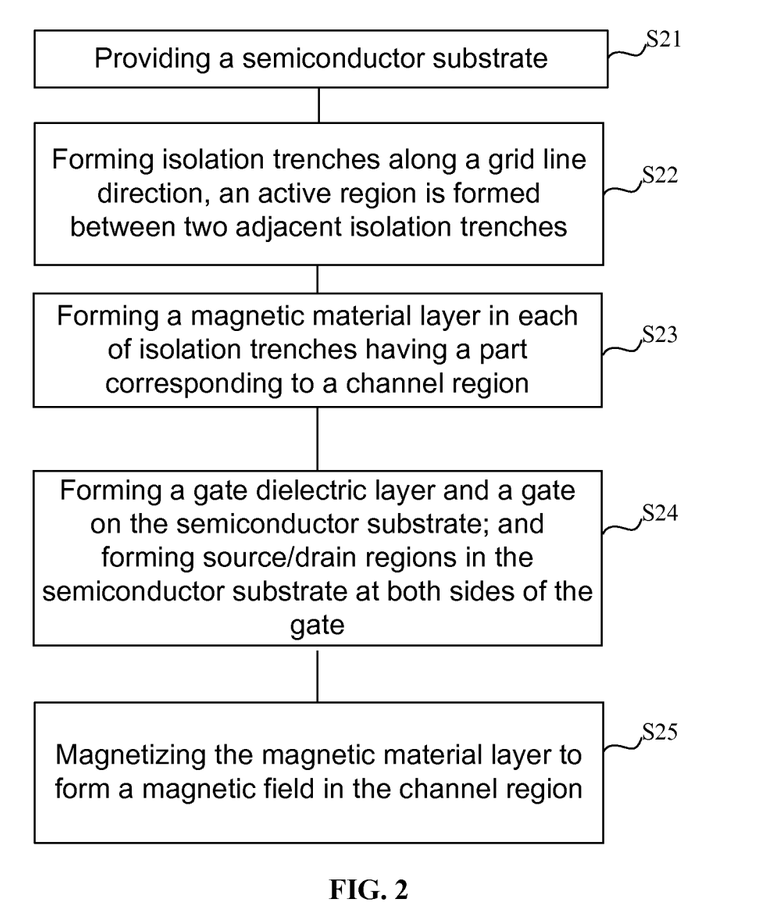
FIG. 2 illustrates an exemplary fabrication process for a CMOS transistor consistent with the disclosed embodiments.

FIG. 2 illustrates an exemplary fabrication process for a CMOS transistor consistent with the disclosed embodiments, and FIGS. 3-12 illustrate exemplary semiconductor structures corresponding to various stages of the fabrication process.

Figure 3:
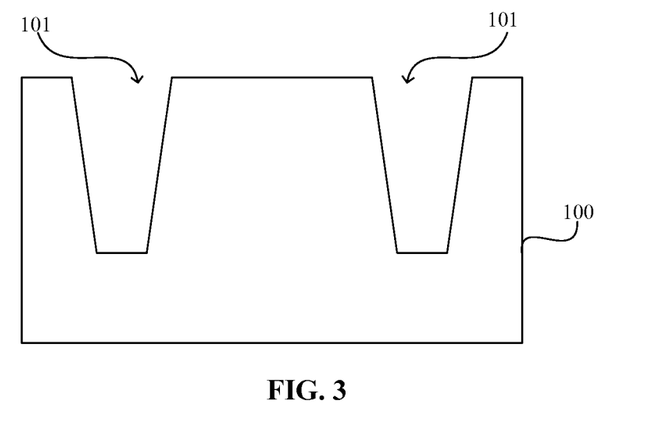
FIGS. 3~12 illustrate semiconductor structures corresponding to certain stages of an exemplary fabrication process for a CMOS transistor consistent with the disclosed embodiments.

As shown in FIG. 2, at the beginning of the fabrication process, a semiconductor substrate with certain structures is provided (S21). FIG. 3 illustrates a corresponding semiconductor structure.

As shown in FIG. 3, a semiconductor substrate 100 is provided. The semiconductor substrate 100 has a plurality of insulation trenches 101 in one surface.

The semiconductor substrate 100 may include any appropriate semiconductor material, such as silicon, silicon on insulator (SOI), silicon germanium, carborundum, indium antimonide, lead telluride, indium arsenide, indium phosphide, gallium arsenidie, gallium antimonite, ally semiconductor or a combination thereof. The semiconductor substrate 100 provides a base for subsequent processes and structures.

As shown in FIG. 3, the isolation trenches 101 may be formed in the semiconductor substrate 100 along a grid line direction (may be referred as a second direction) (S22). A direction from a subsequently formed source region to a subsequently formed drain region may be referred as a first direction. The first direction is perpendicular to the second direction. An active region may be in between adjacent trenches 101. The isolation trenches 101 may be used to form shallow trench isolation (STI) structures.

The isolation trenches 101 may be formed by sequentially: forming a patterned photoresist layer with patterns of the isolation trenches 101 on the semiconductor substrate 100, and exposing a portion of the substrate 100 by the patterns; etching the semiconductor substrate 100 to form the isolation trenches 101 in the semiconductor substrate 100 using the patterned photoresist layer as an etching mask; and removing the patterned photoresist layer. An etching process for forming the isolation trenches 101 may include a plasma etching process, an ion beam etching process, or a wet etching process, etc.

In certain other embodiments, an isolation liner layer (not shown) may be formed to cover an inner surface of each of the trenches 101. The isolation liner layer may be used to prevent subsequently formed magnetic material from diffusing into the active region and the semiconductor substrate 100. The isolation liner layer may be made of any appropriate material, such as silicon oxide, silicon carbide, silicon nitride, or silicon oxynitride, etc. Various processes may be used to form the isolation liner layer, such as a physical vapor deposition (PVD) process, a chemical vapor deposition (CVD) process, or a sputtering process.

Figure 4:
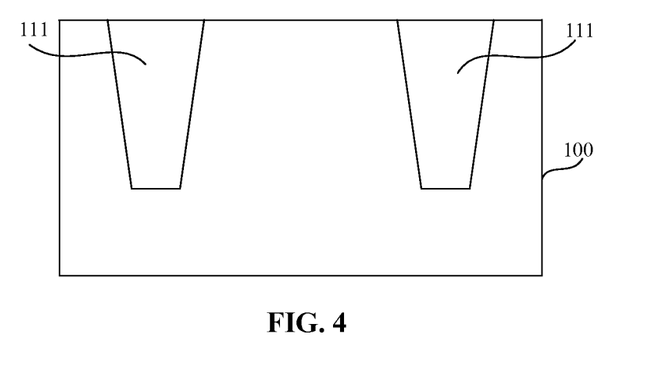

Returning to FIG. 2, after forming the isolation trenches 101, a magnetic layer may be formed in each of the isolation trenches 101 (S23). FIG. 4 illustrates a corresponding semiconductor structure.

As shown in FIG. 4, a magnetic material layer 111 is formed in each of the isolation trenches 101. The magnetic material layer 111 may have a portion corresponding to a subsequently formed channel region. In one embodiment, the magnetic material layer 111 may be completely corresponding to the channel region, that is, a thickness of the magnetic material layer 111 may be approximately equal to a thickness of the channel region, and a bottom of the magnetic material layer 111 may level with a bottom of the isolation trenches 101. In certain other embodiments, the magnetic material layer 111 may be corresponding to a portion of the channel region, and a top surface of the magnetic material layer 111 may be proximity to the surface of the semiconductor substrate 100.

Further, a width of the magnetic material layer 111 along a length direction of the grid line may be greater than or equal to a width of the channel region along the length direction of the grid line. A configuration of a position, the thickness and the width along the length direction of the grid line may ensure the magnetic material layer 111 to form a magnetic field approximately covering the entire channel region after being magnetized, and may ensure a magnetic field with a substantial strength to be formed at a position proximity to an interface between the channel region and a gate dielectric layer.

The magnetic material layer 111 may be made of any appropriate material, such as iron, nickel, or cobalt, etc. The magnetic material layer 111 may also be made of iron oxide, nickel oxide, or cobalt oxide, etc. An alloy made of two or more of iron, nickel, and cobalt, other iron based ally, nickel based ally, or cobalt based alloy may also be used as the magnetic material layer 111. It may be easy to magnetize the iron based alloy, the nickel based alloy, and the cobalt based alloy in a magnetic field.

The magnetic material layer 111 may be formed by: depositing the magnetic material into the isolation trenches 101 and the surface of the semiconductor substrate 100; and removing the magnetic material on the semiconductor substrate 100. The remaining magnetic material in the isolation trenches 101 may form the magnetic material layer 111 in each of the trenches 101.

Various processes may be used to deposit the magnetic material, such as a physical vapor deposition (PVD) process, a chemical vapor deposition (CVD) process, or a sputtering process, etc. The magnetic material on the semiconductor substrate 100 may be removed by any appropriate process, such as a chemical mechanical polishing (CMP) process, a mechanical polishing process, or an etch back process, etc.

Figure 5:
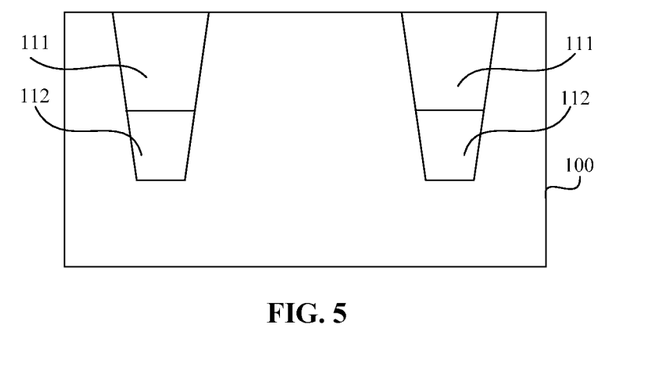

As shown in FIG. 5, in certain other embodiments, a first dielectric layer 112 may be formed in each of the isolation trenches 101 before forming the magnetic material layer 111. The method for forming the first dielectric layer 112 may include: forming a first dielectric material layer in the isolation trenches 101 and on the surface of the semiconductor substrate 100; and removing the first dielectric material layer on the semiconductor substrate 100.

The first dielectric material layer may be formed by any approximately process, such as a CVD process, a PVD process, or a flowable CVD (FCVD) process, etc. In one embodiment, the first dielectric material layer is formed by a CVD process. The first dielectric material layer on the semiconductor substrate 100 may be removed by a CMP process, or an etch back process, etc.

After removing the first dielectric material layer on the semiconductor substrate 100, a top portion of the first dielectric material in the isolation trenches 101 may be further removed to form the first dielectric layer 112 (may refer as an STI partial recess process). A process for forming the first dielectric layer 112 may further include: forming a photoresist layer with patterns corresponding to the isolation trenches 101 on the semiconductor substrate 100; removing a portion of the first dielectric material in the isolation trenches 101 using the photoresist layer as an etching mask; and removing the photoresist layer. A thickness of the removed portion of the first dielectric material may equal to the thickness of a channel region because a remaining portion of the trenches 101 may be used to form the magnetic layer 111.

The first dielectric layer 112 may be used to prevent the magnetic material layer 111 from diffusing into the channel region and the semiconductor substrate 100. A leakage current may be avoided; and a performance of the CMOS transistor may be stabilized. If the isolation liner layer is used, the first dielectric layer 112 may be optional because the isolation liner layer may also be used to prevent a diffusion of the magnetic material layer 111.

Figure 6:
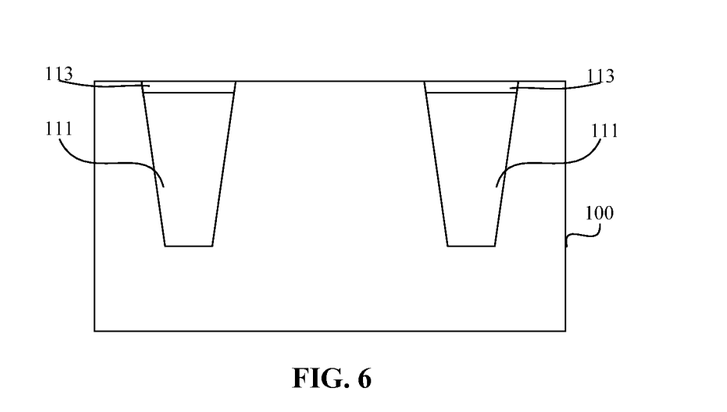

Further, as shown in FIG. 6, in certain other embodiments, a second dielectric layer 113 may be formed on the magnetic material layer 111. A process for forming the second dielectric layer 113 may include: removing a portion of the magnetic material layer 111 (may refer as a magnetism recess process); forming a second dielectric material layer on the remaining magnetic material layer 111 and the surface of the semiconductor substrate 100; and removing the second dielectric material layer on the semiconductor substrate 100.

The second dielectric material may include silicon oxide, silicon nitride, silicon oxynitride, etc. The second dielectric material layer may be formed by any appropriate process, such as a CVD process, a PVD process, or an FCVD process, etc.

Various processes may be used to remove the portion of the magnetic material layer 111, such as plasma etching process, or a wet chemical etching process, etc. The second dielectric material layer on the semiconductor substrate 100 may be removed any appropriate process, such as a CMP process, or an etch back process, etc.

A thickness of the second dielectric layer 113 may be substantially small, which may ensure a relatively strong magnetic field to be formed at a position proximity to an interface between the channel region and a gate dielectric layer after the magnetic material layer 111 is magnetized. The second dielectric layer 113 may be used to protect the magnetic material layer 111. The second dielectric layer 113 may also be used to prevent the magnetic material layer 111 from diffusing to other devices and/or structures.

Figure 7:
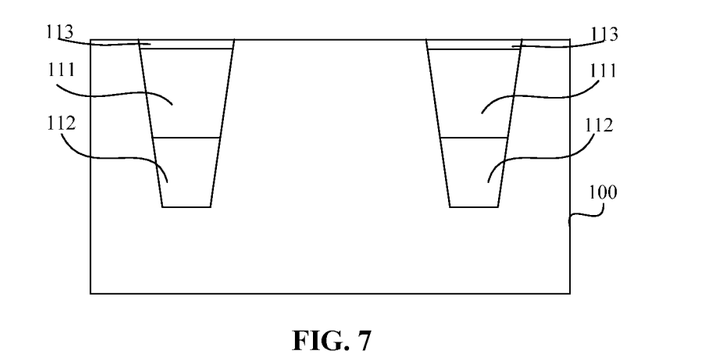

Further, as shown in FIG. 7, in certain other embodiments, a first dielectric layer 112 may be formed in each of the trenches 101. Then a magnetic material layer 111 may be formed on the first dielectric layer 112. Then a second dielectric layer 113 may formed on the magnetic material layer 111.

A process for forming the second dielectric layer 112, the magnetic material layer 111 and the second dielectric layer 113 may include sequentially: forming a photoresist layer having patterns corresponding to the isolation trenches 101 on the semiconductor substrate 100; forming a first dielectric material layer covering the photoresist layer and filling up the isolation trenches 101; removing the first dielectric material on the photoresist layer to expose the photoresist layer; removing a top portion of the first dielectric material layer in the trenches 101 using the photoresist layer as an etching mask to form the first dielectric layer 112 in each of the trenches 101; forming a magnetic material layer covering the photoresist mask and filling up the isolation trenches 101; removing the magnetic material layer on the photoresist mask to expose the photoresist mask; removing a portion of the magnetic material in the trenches 101 using the photoresist layer as an etching mask; forming a second dielectric material layer covering the magnetic layer 111 and the photoresist layer; removing the dielectric layer on the photoresist layer to expose the photoresist layer; removing a portion of the second dielectric material layer higher than the surface on the semiconductor substrate 100 to form the second dielectric layer 113; and removing the photoresist layer.

The first dielectric material and the second dielectric material may include one or more of silicon oxide, silicon nitride, and silicon oxynitride, etc. In one embodiment, the first dielectric material and the second dielectric material are both silicon oxide. The first dielectric material layer and the second dielectric material layer may be formed by any appropriate process, such as a PVD process, a CVD process, or an FCVD process, etc.

Various processes may be used to remove the portion of the first dielectric material layer, the portion of second dielectric material layer, and the portion of the magnetic material layer, such as a dry etching process including a plasma etching process or an ion beam etching process, etc., or a wet etching process using any appropriate etching solutions. The photoresist may be removed by any appropriate process, such as an etching process, or a CMP process, etc.

The magnetic material layer 111 may be made of any appropriate material, such as iron, nickel, or cobalt, etc. The magnetic material layer 111 may also be made of iron oxide, nickel oxide, or cobalt oxide, etc. An alloy made of two or more of iron, nickel, and cobalt, other iron based alloy, nickel based alloy, or cobalt based alloy may also be used as the magnetic material layer 111. The magnetic material layer 111 may be formed by any appropriate process, such as a CVD process, a PVD process, an FCVD process, or a sputtering process, etc.

Figure 8:
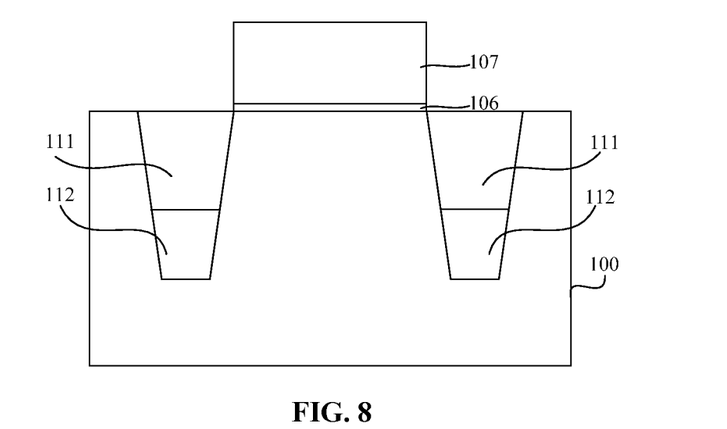

Returning to FIG. 2, after forming the magnetic layer 111, a gate dielectric layer and a gate may be formed (S24). FIG. 8 illustrates a corresponding semiconductor structure.

As show in FIG. 8, a gate dielectric layer 106 is formed on the semiconductor substrate 100 on the active region, a gate 107 is formed on the gate dielectric layer 106. Source/drain regions (not shown) may also be formed in the semiconductor substrate 100 at both sides of the gate 107. Since FIG. 8 is a cross-section view of the grid line direction, source/drain regions may be unable to be shown explicitly.

In one embodiment, if a gate-first approach is used, the gate 107 may be a poly silicon gate. Other appropriate material may also be used for the gate 107. The gate 107, the source/drain regions may be formed by any appropriate process. The gate 107 and the source/drain regions may be formed by any appropriate process.

Figure 9:
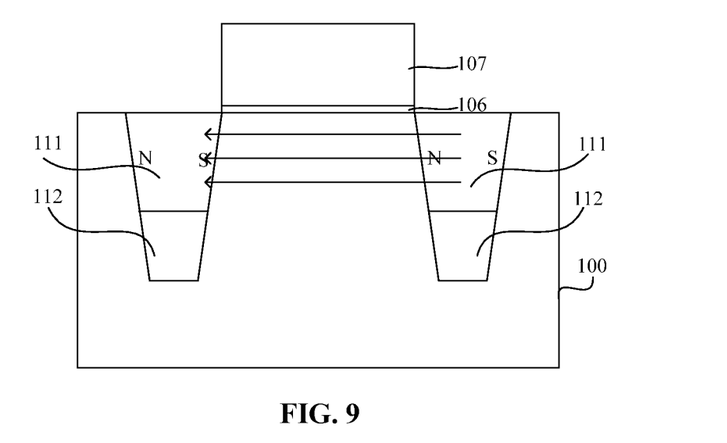

Returning to FIG. 2, after forming the gate 107 and source/drain regions, the magnetic material layer 111 may be magnetized to form a magnetic field in the channel region between two adjacent magnetic material layers 111 (S26). FIG. 9 illustrates a corresponding semiconductor structure.

As shown in FIG. 9, the magnetic material layer 111 is magnetized. A north pole (N pole) and a south pole (S pole) are formed on both sides of the magnetic material layer 111, respectively. Two adjacent magnetic material layers 111 may form a magnetic field in the channel region under the gate 107 (refer to the arrows). In certain other embodiment, the magnetic material layer may be magnetized before forming the gate 107 and the source/drain regions.

Figure 13:
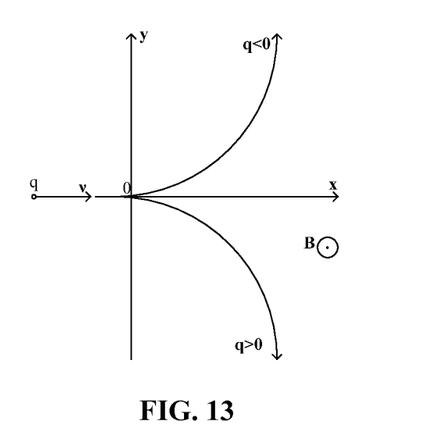
FIG. 13 illustrates the principle of the Lorentz force.

FIG. 13 illustrates the principle of the Lorentz force. As shown in FIG. 13, a (x, y) coordinate may be used to describe the principle of the Lorentz force. The direction of a magnetic field "B" may be defined as a direction perpendicular to and out of the plane of a paper. An initial moving direction of a carrier may be in the positive direction of the x-axis of the coordinate, when the carrier is an electron (q<0), a direction of a Lorentz force generated by the magnetic field "B" is parallel to the plane of the paper and direct to the positive direction of the y-axis of the coordinate. The electron is affected by the Lorentz force along the positive direction of the y-axis of the coordinate, and the moving direction may be changed, and bent to the positive direction of the y-axis. When the carrier is a hole (may refer to q>0), the hole is affected by a Lorentz force along the negative direction of y-axis of the coordinate, and bent to the negative direction of the y-axis of the coordinate.

Figure 10:
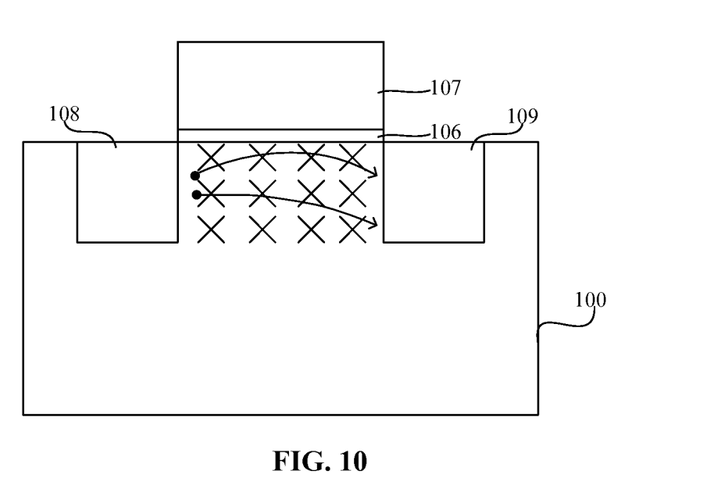

Refer to FIG. 10, the plane of paper herein may refer to the cross-section view a transistor along a direction perpendicular to the surface of substrate 100, and parallel to a gate length direction, i.e., a direction from a source region 108 to a drain region 109. The view of FIG. 10 is perpendicular to the view of FIG. 9.

As shown in FIG. 10, if the transistor is an N-type transistor, a direction of the magnetic field may be perpendicular to and/or into the plane of the paper, as shown as "X". Carriers of the N-type transistor are electrons. Initial moving directions of a portion of the electrons may be toward the interface between the gate dielectric layer 106 and the channel region, such that the portion of the electrons may be reflected by the interface. Referring to the principle of Lorentz force shown in FIG. 13, the portion of electrons now may be affected by a Lorentz force. A direction of the Lorentz force may be parallel to the plane of the paper, and may direct to a direction from the gate structure 107 to the channel region. Trajectories of the portion of electrons may be bent downwardly by the Lorentz force. Thus, the portion of electrons may unlikely be reflected at the interface between the gate dielectric layer 106 and the channel region. The portion of electrons may directly move from the source region 108 to the drain region 109, and form a drive current. That is, the mobility of the carrier is significantly improved with no or less carrier reflection on the interface.

Figure 11:
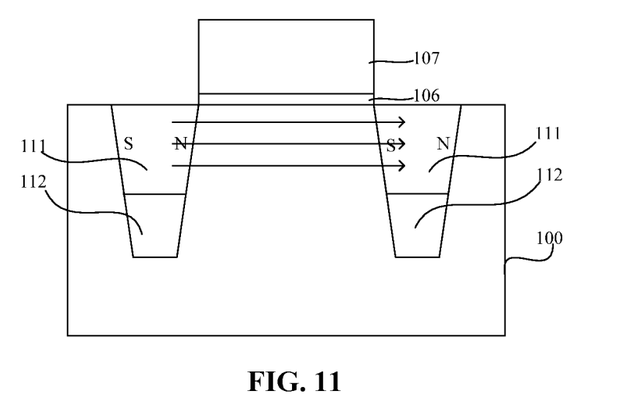

As shown in FIG. 11, the magnetic material layer 111 may be magnetized in another direction. An S-pole and an N-pole are formed on both sides of the magnetic material layer 111, respectively. Two adjacent magnetic material layers 111 may form a magnetic field in the channel region under the gate 107 (refer to the arrows).

Figure 12:
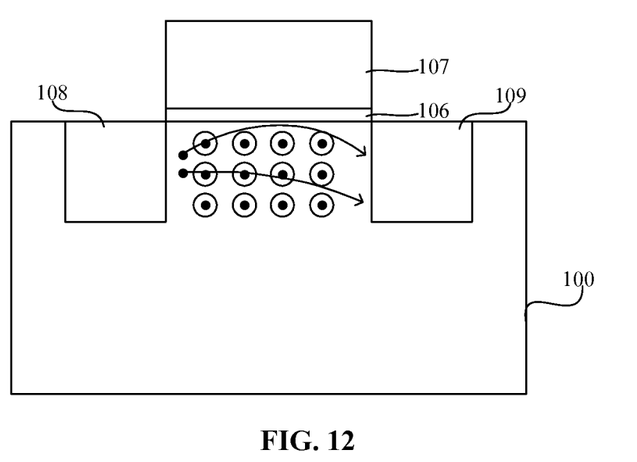

Refer to FIG. 12, the plane of paper herein may refer to the cross-section view the transistor along a direction perpendicular to the surface of substrate 100, and parallel to a gate length direction, i.e., a direction from a source region 108 to a drain region 109. A view of FIG. 12 is perpendicular to a view of FIG. 11.

As shown in FIG. 12, if the transistor is a P-type transistor, a direction of the magnetic field may be perpendicular to and/or out of the plane of the paper, as shown as "⊙". Carriers of the P-type transistor are holes. Initial moving directions of a portion of the holes may be toward the interface between the gate dielectric layer 106 and the channel region, such that the portion of the electrons may be reflected by the interface. Referring to the principle of Lorentz force shown in FIG. 13, the portion of holes may be affected by a Lorentz force generated by the magnetic field. A direction of the Lorentz force may be parallel to the plane of the paper, and may direct to a direction from the gate 107 to the channel region. Trajectories of the portion of holes may be bent downwardly by the Lorentz force. Thus, the portion of holes may unlikely be reflected at the interface between the gate dielectric layer 106 and the channel region. The portion of holes may directly move from the source region 108 to the drain region 109, and form a drive current. That is, the mobility of the carrier is significantly improved with no or less carrier reflection on the interface.

Therefore, after the magnetized magnetic material layers 111 generates an magnetic field in the channel region, the magnetic field may affect the portion of carriers moving toward the interface between the gate dielectric layer 106 and the channel region, and change the trajectories of the portion of carriers. The moving direction of the portion of carriers may be gradually changed such that the portion of carriers may unlikely be reflected at the interface of the gate dielectric layer 106 and the channel region. Thus, the portion of carriers may directly move from the source region 108 to the drain region 109, and form a driving current. Thus, the mobility of carriers in the channel region may be increased by the magnetic field, a driving current of the channel region may be increased, and a performance of the transistor may be enhanced.

The present method may be combined with any other appropriate technology which may provide a stress to enhance the performance of a transistor, such as an embedded GeSi technology, or a stress memorization technology (SMT), etc.

In one embodiment, the present method may be combined with an embedded GeSi technology. Specifically, after forming magnetic material layer and a gate, source/drain regions may be formed. A process for forming the source drain regions may include sequentially: forming sigma-shape trenches in a semiconductor substrate at both sides of the gate; forming semiconductor material in the sigma-shape trenches; and forming source/drain regions in the semiconductor material in the sigma shape trenches. If the CMOS transistor is an N-type transistor, the semiconductor material may be silicon carbide. If the CMOS transistor is a P-type transistor, the semiconductor material may be GeSi.

In certain other embodiments, the present method may be combined with an SMT. Specifically, after forming magnetic layers, a gate, and source/drain regions, a stress layer may be formed on the semiconductor substrate to cover the gate and the source/drain regions. If the CMOS transistor is an NMOS transistor, the stress layer may be a tensile stress layer. A tensile stress in the tensile stress layer may be "memorized" in the gate and the source/drain regions. If the CMOS transistor is a PMOS transistor, the stress layer may be a compressive stress layer. A compressive stress in the compressive stress layer may be "memorized" in the gate and the source/drain regions. The stress layer may be kept or removed. A magnetization process of the magnetic material layer may be performed before or after the SMT.

The SMT, the embedded GeSi technology, or other related methods may be used to reduce carrier reflections from crystal lattices. The present method may be used to reduce carrier reflections from the interface between a gate dielectric layer and a channel region. Thus, the SMT, the embedded GeSi technology or other methods providing a stress are combined with the present method, a desired effect for improving the carrier mobility in the channel region may be obtained, the performance of a transistor may be significantly enhanced.

Thus, a CMOS transistor may be formed by the above disclosed processes and methods, a corresponding CMOS transistor is illustrated in FIG. 11. The CMOS transistor includes a substrate 100. The CMOS transistor also includes a plurality of magnetized magnetic material layers 111 and first dielectric layers 112, and each magnetized magnetic material layer 111 has an S pole and an N pole which form a magnetic field in a channel region. Further, the CMOS transistor includes a gate dielectric layer 106 and a gate 107. Further, the CMOS transistor also includes a source region 108 and a drain region 109 (refer to FIG. 12). The detailed structures and intermediate structures are described above with respect to the fabrication processes.

Figure 14:
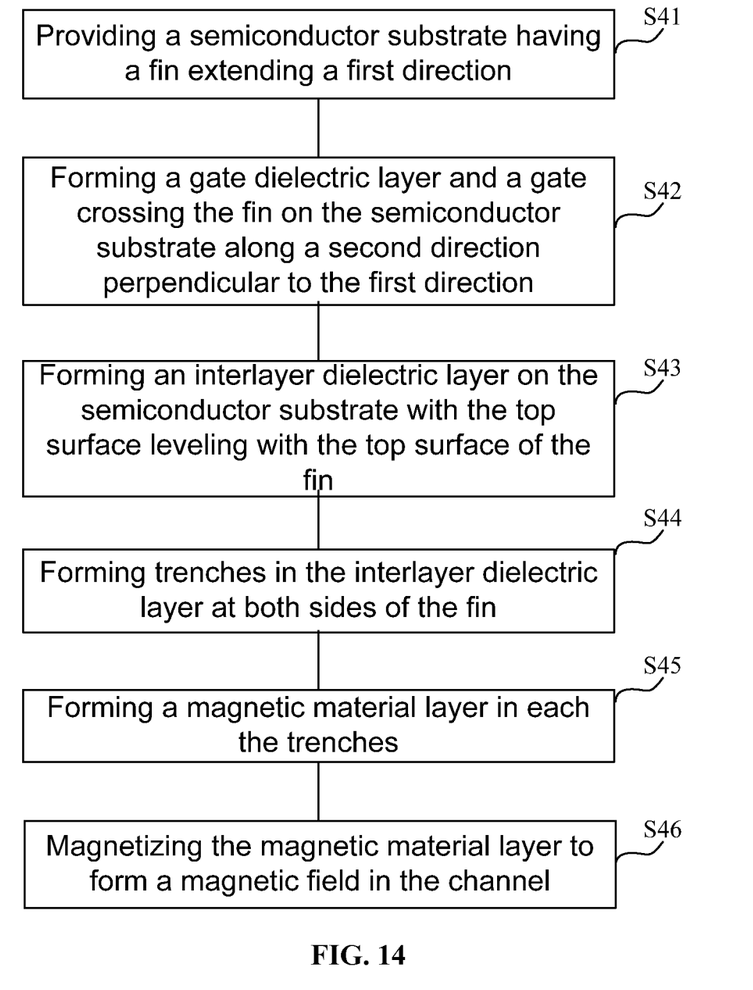
FIG. 14 illustrates an exemplary fabrication process for a FinFET consistent with the disclosed embodiments.

FIG. 14 illustrate an exemplary fabrication process for a fin field-effect transistor (FinFET), and FIG. 15~20 illustrate semiconductor structures corresponding to certain stages of an exemplary fabrication process for a FinFET consistent with the disclosed embodiments.

Figure 15:
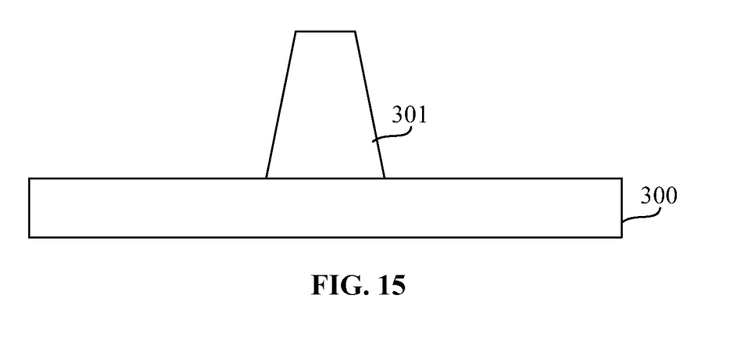
FIG. 15, and FIGS. 17~20 illustrate semiconductor structures corresponding to certain stages of an exemplary fabrication process for a FinFET consistent with the disclosed embodiments.

As shown in FIG. 14, at the beginning of the fabrication process, a semiconductor substrate certain structure is provided (S41). FIG. 15 illustrates a corresponding semiconductor structure.

As shown in FIG. 15, a semiconductor substrate 300 is provided, and a fin 301 may be formed on the semiconductor substrate 300. The semiconductor substrate 300 may include any appropriate type of semiconductor material, such as single crystal silicon, poly silicon, amorphous silicon, silicon germanium, carborundum, indium antimonide, lead telluride, indium arsenide, indium phosphide, gallium arsenide, gallium antimonide, alloy semiconductor, epitaxially grown materials, or silicon on insulator (SOI), etc.

In one embodiment, the semiconductor substrate 300 is an SOI substrate having a base silicon, an isolator on the base silicon and a top silicon layer on the isolator. The fin 301 may be formed by etching the top silicon layer of the SOI substrate. In certain other embodiments, the fin 301 may be formed by etching the semiconductor substrate 300. In certain other embodiments, the fin 301 may also be formed by depositing a layer of fin material on the semiconductor substrate 300, followed by patterning the fin material layer.

An etching process for forming the fin 301 may be a dry etching process including a plasma etching process, or an ion beam etching process, or a wet etching process, etc. The fin 301 may be made of a same material as the semiconductor substrate 300, or a different semiconductor material including one or more of silicon, silicon germanium, carborundum, indium antimonide, lead telluride, indium arsenide, indium phosphide, gallium arsenidie, gallium antimonite, or ally semiconductor, etc. A process for depositing the fin material layer may be a CVD process, a PVD process, an atomic layer deposition process, or an epitaxial growth process, etc.

Figure 16:
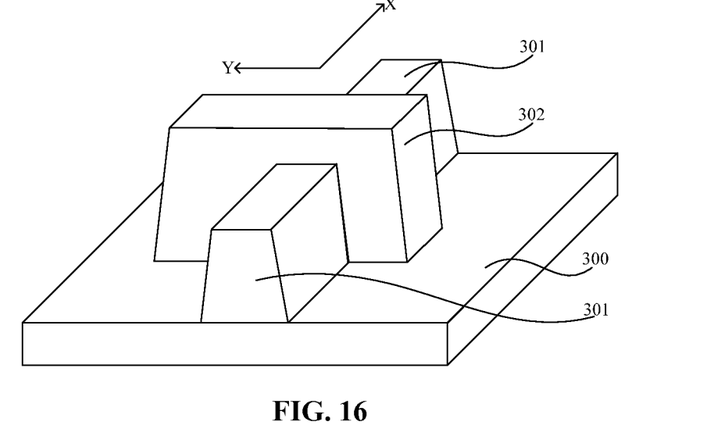
FIG. 16 illustrates a three dimensional structure of a FinFET consistent with the disclosed embodiments.

After forming the fin 301, a gate dielectric layer (not shown) crossing over the fin 301 may be formed on the semiconductor substrate 300, and a gate may be formed on the gate dielectric layer (S42). FIG. 16 illustrates a corresponding three dimensional semiconductor structure.

Figure 17:
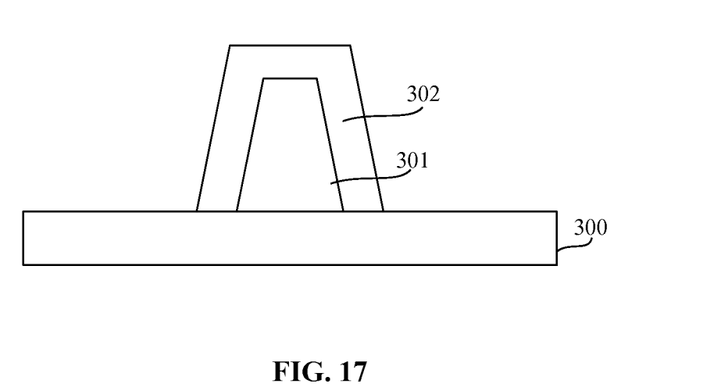

As shown in FIG. 16, a gate 302 is formed on the semiconductor substrate 300, and crossing over the fin 301. The gate 302 may extend along a second direction (Y direction). A direction perpendicular to the second direction (Y direction) may be referred as a first direction (X direction), which may be along the fin 301. FIG. 17 illustrates a cross-section view of the fin 301 and the gate 302 along the second direction (Y direction).

The gate dielectric layer and the gate 302 may be formed by: forming a gate dielectric material and a gate material covering the semiconductor substrate 300 and the fin 301; and patterning the gate dielectric material and the gate material to form the gate dielectric layer (not shown) and the gate 302 crossing over the fin 301. The gate dielectric material may be silicon oxide, or high dielectric constant material, etc. The gate material may be any appropriate metal.

Various processes may be used to form the gate dielectric material, such as a CVD process, a PVD process, or an FCVD process, etc. The gate material may be formed by any appropriate process, such as a PVD process, a CVD process, a sputtering process, or an electroplating process, etc.

Figure 18:
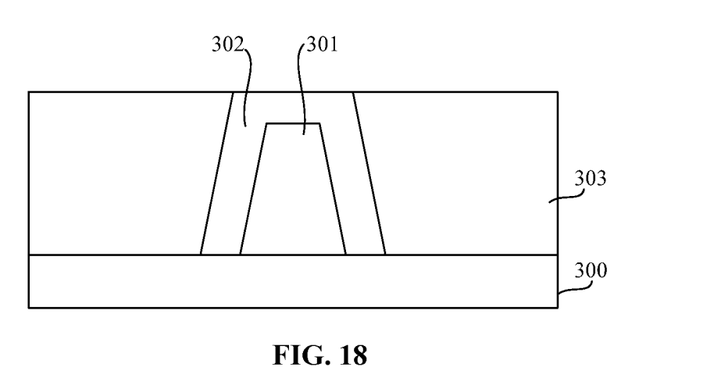

Returning to FIG. 14, after forming the gate 302, an interlayer dielectric layer may be formed on the semiconductor substrate 300 (S43). FIG. 18 illustrates a corresponding semiconductor structure.

As shown in FIG. 18, an interlayer dielectric layer 303 is formed on the semiconductor substrate 300. The top surface of the interlayer dielectric layer 303 may level with the top surface of the gate 302.

The interlayer dielectric layer 303 may be made of any appropriate material, such as silicon oxide, silicon nitride, silicon oxynitride, etc. In one embodiment, the interlayer dielectric layer 303 is made of silicon oxide.

The interlayer dielectric layer 303 may be formed by depositing an interlayer dielectric material layer on the semiconductor substrate 300, followed by a CMP process, or an etch back process, etc., to make the top surface of the interlayer dielectric layer 303 level with the top surface of the gate 302. Various processes may be used to deposit the interlayer dielectric material layer, such as a CVD process, a PVD process, an FCVD process, or an atomic layer deposition (ALD) process, etc.

Figure 19:
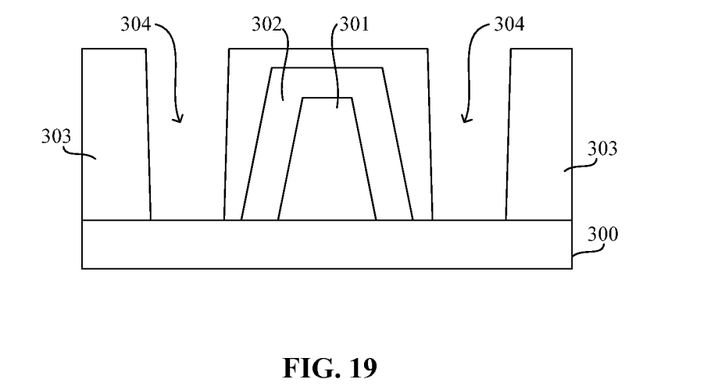

Returning to FIG. 14, after forming the interlayer dielectric layer 303, a plurality of trenches may be formed in the interlayer dielectric layer 303 (S44). FIG. 19 illustrates a corresponding semiconductor.

As shown in FIG. 19, trenches 304 are formed in the interlayer dielectric layer 303. The trenches 304 are formed at both sides of a channel region under the gate 302 along the second direction (Y direction). The trenches 304 are corresponding to the channel region. After subsequently forming a magnetic layer in each of the trenches 304, the magnetized magnetic layers may form a magnetic field in the channel region, and affect a movement of carriers in the channel region. The trenches 304 may be formed by a dry etching process, or a wet etching process, etc.

In one embodiment, the carriers of the channel region may concentrate at a region proximity to the gate dielectric layer, that is, the top surface of the fin 301 under the gate 302. Thus, a depth of the trenches 304 may be set to ensure that the magnetic layer may be at least corresponding to a top portion of the fin 301, which may ensure that the magnetic field between the magnetic material layers are able to generate a Lorentz force to reflect carriers.

Further, the trenches 304 are in the interlayer dielectric layer 303, bottoms of the trenches 304 may be the top surface of the semiconductor substrate 300. The bottoms of the trenches 304 may be also be the interlayer dielectric layer 303. That is, the depth of the trenches 304 may be equal to a thickness of the interlayer dielectric layer 303, or the depth of the trenches 304 may be smaller than the thickness of the interlayer dielectric layer 303. If the depth of the trenches 304 is smaller than the thickness of the interlayer dielectric layer 303, a portion of the interlayer dielectric layer 303 under the trenches 304 may have functions of isolation and protection, which may prevent a subsequently formed magnetic material from being diffusing into the semiconductor substrate 300, the channel region, and other semiconductor devices.

Figure 20:
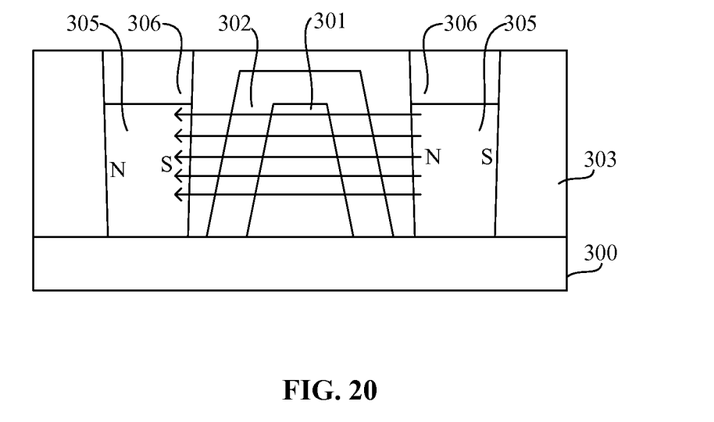

Returning to FIG. 14, after forming trenches 304, a magnetic material layer may be formed in each of the trenches 304 (S45). FIG. 20 illustrates a corresponding semiconductor structure.

As shown in FIG. 20, a magnetic material layer 305 is formed in each of the trenches 304. In one embodiment, the top surface of the magnetic material layer 305 may level with the top surface of the fin 301.

The magnetic material layer 305 may be formed by: forming a magnetic material layer covering the interlayer dielectric layer 303 and filling up the trenches 304; and removing a portion of the magnetic material above the interlayer dielectric layer 303. A remaining portion of the magnetic material in the trenches 304 may form the magnetic material layers 305.

If a thickness of the magnetic material layer 303 is smaller than the depth of the trenches 304, a top portion of the magnetic material layer 303 may be removed. The top surface of the magnetic material layer 305 may level with the top surface of the fin 301. The top surface of the magnetic material layer 305 may also be slightly higher than the top surface of the fin 301.

Various processes may be used to form the magnetic material, such as a CVD process, a PVD process, or a sputtering process, etc. The magnetic material may include iron, nickel, or cobalt, etc. The magnetic material may also include iron oxide, nickel oxide, or cobalt oxide, etc. An alloy made of two or more of iron, nickel, and cobalt, other iron based alloy, nickel based alloy, or cobalt based alloy may also be used as the magnetic material.

A process for removing the portion of the magnetic material above the interlayer dielectric layer 303 may include a CMP process, or an etch back process, etc. If an etch back process is used, the top portion of the magnetic material layer 305 may be removed simultaneously.

In one embodiment, referring to FIG. 20, if the thickness of the magnetic material layer 305 is smaller than the depth of the trenches 304, a dielectric layer 306 may be formed on the magnetic material layer 305. The dielectric layer 306 may be used to protect the magnetic material layer 305. The dielectric layer 306 may also be used to isolate the magnetic material layer 305 and other semiconductor devices and/structures, and prevent the magnetic material layer 305 from diffusing into other semiconductor devices and/or structures.

The dielectric layer 306 may be made of any appropriate material, such as silicon oxide, silicon nitride, silicon oxynitride, or aluminum oxide, etc. Various methods may be used to form the dielectric layer 306, such as a CVD process, a PVD process, or an ALD process, etc.

Returning to FIG. 14, after forming the magnetic material layer 305 in each of the trenches 304, the magnetic material layer 305 may be magnetized (S46). A corresponding structure is illustrated in FIG. 20.

As shown in FIG. 20, the magnetic material layer 305 is magnetized, and an N pole and an S pole are formed in the magnetic layer 305. A magnetic field may be formed in the channel region by the two adjacent magnetic material layers 305, that is, the magnetic field is formed the fin 301 under the gate 301.

A cross-section view of the FinFET vertical to the second direction may be referred as a plane of the paper. In one embodiment, if the FinFET is an N type transistor, a direction of the magnetic field may be perpendicular to, and into the plane of the paper. The direction of the magnetic field for the N type transistor may refer to the arrows shown in FIG. 20.

In certain other embodiments, if the FinFET is a P type transistor, a direction of the magnetic field may be perpendicular to, and out of the plane of the paper. The direction of the magnetic field for the P type transistor may refer to the arrows shown in FIG. 11.

After the magnetization process, the magnetic field is formed in the channel region of the FinFET. When the FinFET is in operation, a portion of the carriers in the channel region may move toward to the interface between the gate dielectric and the channel region. The portion of the carriers moving toward the interface may be affected by a Lorentz force generated by the magnetic field. Trajectories of the portion of carriers may be bent, and gradually move to a direction away from the interface. Thus, the portion of carriers may move directly from a source region to a drain region without being deflected by the interface, and form a driving current. A mobility of carriers in the channel region may be increased by the magnetic field, thus a driving current of the channel region may be increased, and a performance of the transistor may be enhanced.

Referring to FIG. 16, after forming the magnetic material layer 305, source/drain regions (not shown) may be formed at both ends of the fin 301, that is, at both sides of the gate 302 along the first direction. The sources/drain regions may be formed by any appropriate process.

Thus, a FinFET may be formed by the above disclosed processes and methods. A corresponding FinFET is illustrated in FIG. 20. The FinFET includes a semiconductor substrate 300 having a fin 301. The FinFET also includes a gate dielectric layer (not shown) and a gate 302 crossing over the fin 301, and an interlayer dielectric layer 303 on the semiconductor substrate 300. Further, the FinFET includes a plurality of magnetic material layers 305 and dielectric layers 306 on the magnetic material layers 305 in the interlayer dielectric layer at both sides of the fin 301. Further, the FinFET also includes source/drain regions at both ends of the fin 301. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a transistor, comprising:
providing a semiconductor substrate;
configuring a channel region along a first direction;
forming trenches at both sides of the channel region along a second direction;
forming a magnetic material layer in each of the trenches;
magnetizing the magnetic material layer to form a magnetic field between adjacent magnetic material layers in the channel region; and
forming source/drain regions at both ends of the channel region along the first direction.

2. The method according claim 1, wherein:
the first direction is a direction from a source region to a drain region; and
the second direction is perpendicular to the first direction.

3. The method according to claim 1, wherein configuring the channel region further includes:
an active region between two trenches along the first direction is a channel for a CMOS transistor; and
a fin structure along the first direction is a channel region for a fin field-effect transistor.

4. The method according to claim 1, after forming the magnetic material layer, further including:
forming a gate dielectric layer on the channel region; and
forming a gate on the gate dielectric layer.

5. The method according to claim 1, before forming the trenches, further including:
forming a fin on the semiconductor substrate;
forming a gate dielectric layer on the semiconductor substrate crossing over the fin;
forming a gate on the gate dielectric layer crossing the fin; and
forming an interlayer dielectric layer on the semiconductor substrate.

6. The method according to claim 1, before forming the magnetic material layer, further including:
forming a liner layer in the trenches to cover inner surfaces of the trenches.

7. The method according to claim 1, before forming the magnetic material layer, further including:
forming a first dielectric layer in bottom portions of the trenches.

8. The method according to claim 1, after forming the magnetic material layer, further including:
removing a top portion of the magnetic material layer; and
forming a second dielectric layer on the magnetic material layer.

9. The method according to claim 1, wherein forming the source/drain regions further includes:
forming sigma-shape trenches in the semiconductor substrate at both ends of the channel region;

filling the sigma-shape trenches with a semiconductor material;
performing an ion implantation process on the semiconductor material to form the source/drain regions.

10. The method according to claim 1, after forming the source/drain regions, further including:
forming a stress layer on the semiconductor substrate to cover the source/drain regions and a gate region.

11. The method according to claim 1, wherein:
a thickness of the magnetic material layer is equal to a depth of the channel region; and
the bottom surface of the magnetic material layer levels with the bottom surface of the channel region.

12. The method according to claim 1, wherein:
the magnetic material layer is formed by a chemical vapor deposition process, a physical vapor deposition process, or a sputtering process.

13. The method according to claim 1, wherein:
the magnetic material includes one of iron, nickel, cobalt, iron oxide, nickel oxide, or cobalt oxide, etc., or an alloy made of two or more of iron, nickel, and cobalt.

14. A CMOS transistor, comprising:
a semiconductor substrate having an active region;
a gate dielectric layer and a gate on the active region;
magnetic material layers at both sides of the active region along a second direction;
source/drain regions at both sides of the active region along a first direction perpendicular to the second direction;
a channel region between the source/drain regions; and
a magnetic field in the channel region along a second direction,
wherein the magnetic field is formed by:
    forming isolation trenches in the semiconductor substrate along the second direction;
    forming a magnetic material layer in each of the trenches; and
    magnetizing the magnetic material layers to form the magnetic field.

15. The CMOS transistor according to claim 14, wherein:
a liner layer is formed in each of the trenches to cover an inner surface of each of the trenches;
a first dielectric layer is formed in trenches under the magnetic material layer; and
a second dielectric layer is formed on the magnetic material layer.

16. The CMOS transistor according to claim 14, wherein:
a cross-section of the CMOS transistor along a first direction and a direction vertical to the semiconductor substrate is referred as a plane of a paper;
if the CMOS transistor is an N type transistor, a direction of the magnetic field is perpendicular to the plane of the paper, and into the plane of the paper; and
if the CMOS transistor is a P type transistor, a direction of the magnetic field is perpendicular to the plane of the paper, and out of the plane of the paper.

17. The CMOS transistor according to claim 14, wherein:
the source/drain regions are sigma shape trenches filled with an ion implanted semiconductor material; and
a stress layer is formed on the semiconductor substrate to cover the source/drain regions and the gate.

18. A fin field-effect transistor, comprising:
a semiconductor substrate;
a fin on the semiconductor substrate extending along a first direction;
a gate crossing over the fin on the semiconductor substrate extending along a second direction perpendicular to the first direction;
an interlayer dielectric layer on the semiconductor substrate;
magnetic material layers having a south pole and a north pole in the interlayer dielectric layer at both sides of the fin along a second direction;
source/drain regions at both ends of the fin along the first direction; and
a magnetic field in a channel region along the second direction under the gate,
wherein the magnetic field is formed by:
    forming trenches in the interlayer dielectric layer at both sides of the fin along the second direction;
    forming a magnetic material layer in each of the trenches; and
    magnetizing the magnetic material layer to form a magnetic field between adjacent magnetic material layers in the channel region.

19. The fin field-effect transistor according to claim 18, wherein:
a cross-section of the field effect transistor vertical to the second direction is referred as a plane of a paper;
if the fin field-effect transistor is an N type transistor, a direction of the magnetic field is perpendicular to the plane of the paper, and into the plane of the paper; and
if the fin field-effect transistor is a P type transistor, a direction of the magnetic field is perpendicular to the plane of the paper, and out of the plane of the paper.

20. The fin field-effect transistor according to claim 18, wherein:
a dielectric layer is formed on the magnetic material layer.

* * * * *